United States Patent [19]
Lee et al.

[11] Patent Number: 6,150,276
[45] Date of Patent: Nov. 21, 2000

[54] METHOD FOR FABRICATING METAL-OXIDE SEMICONDUCTOR TRANSISTOR

[75] Inventors: Claymens Lee, Fengshan; Gary Hong, Hsinchu, both of Taiwan

[73] Assignee: United Semiconductor Corp., Hsinchu, Taiwan

[21] Appl. No.: 09/313,166

[22] Filed: May 17, 1999

[30] Foreign Application Priority Data

Mar. 26, 1999 [TW] Taiwan .................................. 88104796

[51] Int. Cl.[7] ........................ H01L 21/311; H01L 21/302
[52] U.S. Cl. ............................................ 438/696; 697/745
[58] Field of Search ..................................... 438/696, 697, 438/745

[56] References Cited

U.S. PATENT DOCUMENTS 5,015,599  5/1991  Verhaar .................................... 438/300
5,093,275  3/1992  Tasch, Jr.et al. ......................... 438/304

Primary Examiner—Benjamin L. Utech
Assistant Examiner—Lynette T. Umez-Eronini
Attorney, Agent, or Firm—Jiawei Huang; J.C. Patents

[57] ABSTRACT

A method for fabricating a metal-oxide semiconductor (MOS) transistor on a semiconductor substrate is described. The invention introduces an air chamber with a low dielectric constant between the gate and the source/drain region so as to lower the fringing electric field between the gate and the source/drain region. Moreover, the dielectric constant of the dielectric layer between the gate and the source/drain region is reduced. Therefore, the gate-to-drain capacitance is decreased in the MOS transistor.

12 Claims, 2 Drawing Sheets

6,150,276

METHOD FOR FABRICATING METAL-OXIDE SEMICONDUCTOR TRANSISTOR

CROSS-REFERENCE TO RELATED APPLICATION

This application claims the priority benefit of Taiwan application serial no. 88104796, filed Mar. 26, 1999, the full disclosure of which is incorporated herein by reference.

BACKGROUND OF THE INVENTION

1. Field of Invention

The present invention relates to a method for fabricating a semiconductor device. More particularly, the present invention relates to a method for fabricating a metaloxide semiconductor (MOS) transistor.

2. Description of Related Art

In a conventional method of forming a metal-oxide semiconductor (MOS) transistor, an oxide layer is commonly formed to cover and electrically isolate the MOS transistor. The dielectric constant of oxide is approximately 3.8 to 4.0. As the device dimensions reduce in size and the transmission speed increases, the oxide layer does not satisfactorily provide electrical isolation, because using the oxide layer for electrical isolation causes a serious gate-to-drain capacitance between the gate and the source/drain region. Thus, the performance of the device is affected.

SUMMARY OF THE INVENTION

The invention provides a method for fabricating a metal-oxide semiconductor (MOS) transistor on a semiconductor substrate. A semiconductor substrate is provided. A gate is formed on the substrate, and a first doped region is formed in the substrate beside the gate. A first dielectric layer with a first thickness is formed on the substrate beside the gate wherein the first dielectric layer having a first surface level lower than that of the gate. A first spacer is formed on a sidewall of the gate. A part of the first dielectric layer is anisotropically etched until the first dielectric layer having a second surface level lower than the first surface level, with the gate and the first spacer serving as a mask. A second spacer is fomred to cover the first spacer and a part of the first dielectric layer. The first dielectric layer is anisotropically etched to expose the substrate, with the second spacer and the gate serving as a mask. A second doped region is formed in the substrate with the second spacer and the gate serving as a mask, wherein the first and the second doped regions form a source/drain region. The remaining first dielectric layer is removed. A second dielectric layer is formed to cover the gate.

Accordingly, the invention introduces an air chamber with a low dielectric constant between the gate and the source/drain region so as to lower the fringing electrical field between the gate and the source/drain region. Moreover, the dielectric constant of the dielectric layer between the gate and the source/drain region is reduced. Therefore, the gate-to-drain capacitance is decreased in the MOS transistor.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
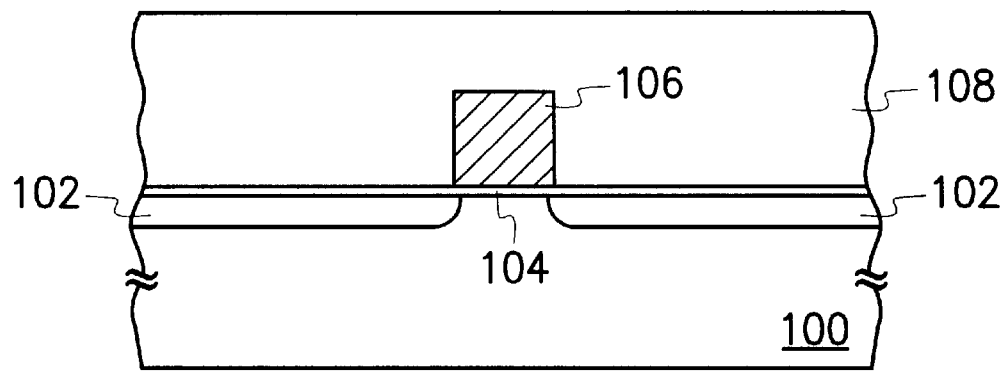
FIGS. 1A through 1E are schematic, cross-sectional views showing a method for fabricating a metal-oxide semiconductor (MOS) transistor according to one preferred embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1A through 1E are schematic, cross-sectional views showing a method for fabricating a metal-oxide semiconductor (MOS) transistor according to one preferred embodiment of this invention.

Referring to FIG. 1A, a semiconductor substrate 100 is provided. A gate oxide layer 104 and a gate 106 are subsequently formed on the substrate 100. The gate 106 includes, for example, polysilicon, amorphous silicon, or a similar material. With the gate 106 serving as a mask, an ion implantation step is performed to form a doped region 102 in the substrate 100 beside the gate 106. The doped region 102 can be a lightly doped region. The dopant is determined by the conductive type of a required metal-oxide semiconductor (MOS) transistor subsequently formed. A planarized dielectric layer 108 is formed over the gate 106. The method of planarization is, for example, chemical mechanical polishing (CMP). The dielectric layer 108 includes, for example, silicon oxide.

Figure 1B:
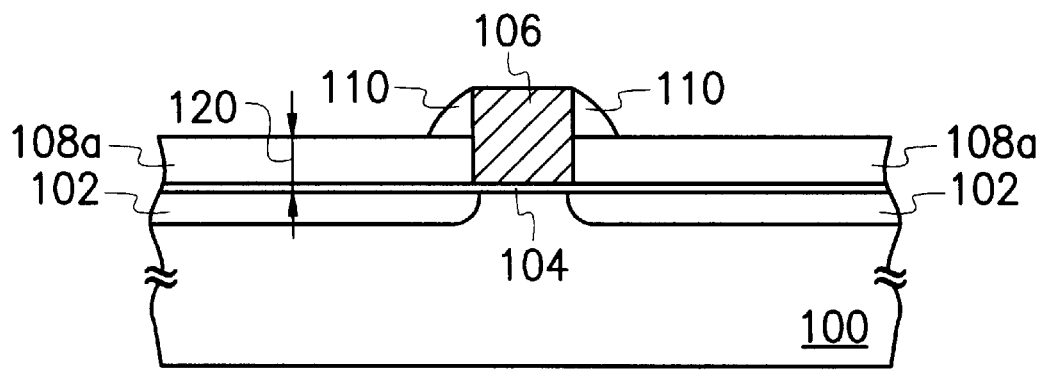

Referring to FIG. 1B, a part of the dielectric layer 108 (FIG. 1A) is removed until a part of a sidewall of the gate 106 is exposed. The remaining thickness 120 is preferably from about 1500 Å to about 2000 Å. The remaining dielectric layer 108 is denoted as 108a in FIG. 1B. The removal method includes, for example, anisotropic etching back. A spacer 110 is formed on the exposed part of the sidewall of the gate 106. The material of the spacer 110 is preferably different from that of the dielectric layer 108a. The spacer 110 includes, for example, silicon nitride.

Figure 1C:
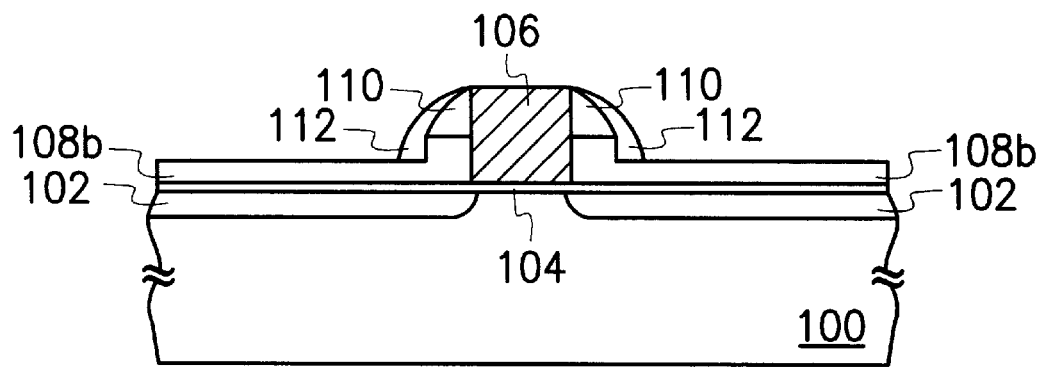

Referring to FIG. 1C, with the gate 106 and the spacer 110 serving as a mask, a part of the dielectric layer 108a (FIG. 1B) is etched until the remaining thickness 122 is preferably from about 500 Å to 1000 Å. The remaining dielectric layer is denoted as 108b in FIG. 1C. Another spacer 112 is formed to cover the spacer 110 and a part of the dielectric layer 108b. The material of the spacer 112 is preferably different from that of the dielectric layer 108b, and preferably the same as that of the spacer 110. The spacer 112 includes, for example, silicon nitride.

Figure 1D:
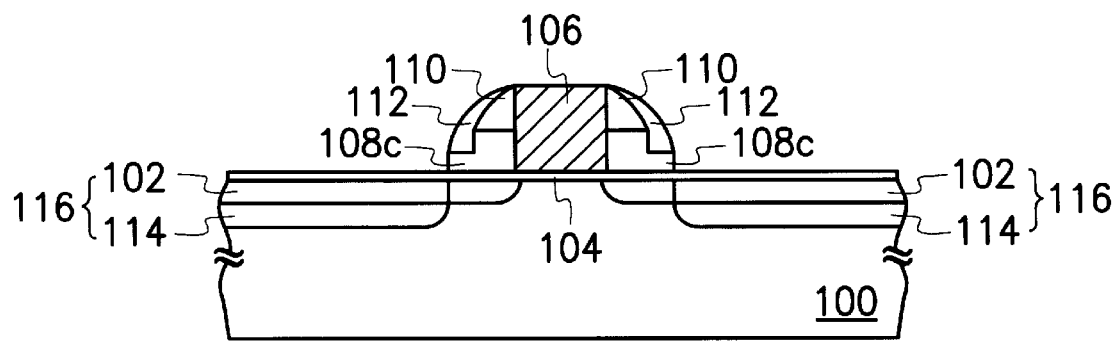

Referring to FIG. 1D, with the gate 106 and the spacer 112 serving as a mask, the dielectric layer 108b (FIG. 1C) is etched until the gate oxide layer 104 is exposed. The remaining dielectric layer 108c remains under the spacers 110 and 112. Using the gate 106 and the spacer 112 as a mask, an ion implantation step is performed to form a doped region 114 in the substrate 100. The doped region 114 can be a heavily doped region. The doped ion includes, for example, ions the same as those of the doped region 102. The doped region 102 and the doped region 114 form a source/drain region 116.

Figure 1E:
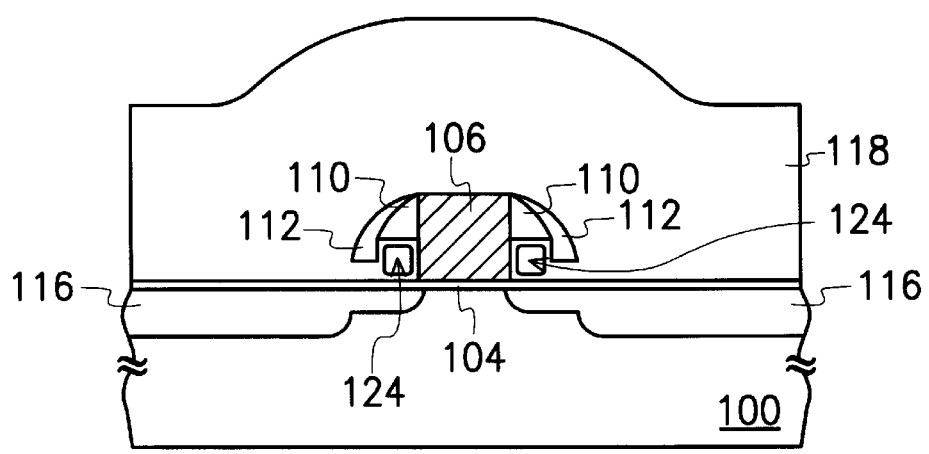

Referring to FIG. 1E, the dielectric layer 108c covered by the spacer 110 and the spacer 112 is removed. Since the spacers 110 and 112 have different materials from that of the dielectric layer 108c, only the dielectric layer 108c is removed. Thus, a gate structure, having the distance between the outer spacer 112 and the substrate 100 smaller than that between the inner spacer 110 and the substrate 100, is formed. The removal method includes, for example, wet etching. The etchant includes, for example, hot phosphoric acid. A dielectric layer 118 is formed to cover the gate 106. The dielectric layer 118 includes, for example, silicon oxide. Since the distance between the outer spacer 112 and the substrate 100 is smaller than that between the inner spacer 110 and the substrate 100, step coverage becomes worse so that an air chamber 124 forms under the spacers 110 and 112.

The dielectric constant of air is about 1.0. Therefore, the gate-to-drain capacitance is reduced. The performance of the gate is enhanced and the circuit speed is increased.

The invention introduces an air chamber with a low dielectric constant between the gate and the source/drain region so as to lower the fringing electric field between the gate and the source/drain region.

Additionally, the invention forms an air chamber with a low dielectric constant between the gate and the source/drain region so that the dielectric constant of the dielectric layer between the gate and the source/drain region is reduced. Therefore, the gate-to-drain capacitance is decreased in the MOS transistor.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for fabricating a metal-oxide semiconductor (MOS) transistor, comprising:

providing a semiconductor substrate, wherein a gate is formed on the substrate, and a first doped region is formed in the substrate beside the gate;

forming a first dielectric layer with a first thickness on the substrate beside the gate, the first dielectric layer having a first surface level lower than that of the gate;

forming a first spacer on a sidewall of the gate;

anisotropically etching a part of the first dielectric layer until the first dielectric layer having a second surface level lower than the first surface level, with the gate and the first spacer serving as a mask;

forming a second spacer to cover the first spacer and a part of the first dielectric layer;

anisotropically etching the first dielectric layer to expose the substrate, with the second spacer and the gate serving as a mask;

forming a second doped region in the substrate with the second spacer and the gate serving as a mask, wherein the first and the second doped regions form a source/drain region;

removing the remaining first dielectric layer; and forming a second dielectric layer to cover the gate.

2. The method according to claim 1, wherein the first dielectric layer has a material different from that of the first and the second spacers.

3. The method according to claim 2, wherein the first dielectric layer comprises silicon nitride, and the first and the second spacers comprise silicon nitride.

4. The method according to claim 1, wherein the step of forming a first dielectric ayer with a first thickness on the substrate beside the gate comprises:

forming a planarized dielectric layer over the substrate; and etching back the planarized dielectric layer.

5. The method according to claim 1, wherein the first thickness is from about 1500 Å to about 2000 Å, and the second thickness is from about 500 Å to 1000 Å.

6. The method according to claim 1, wherein the remaining first dielectric layer is removed by wet etching.

7. A method for fabricating a metal-oxide semiconductor (MOS) transistor, comprising:

providing a semiconductor substrate, wherein a gate is formed on the substrate, and a first doped region is formed in the substrate beside the gate;

forming a first dielectric layer with a first thickness on the substrate beside the gate, the first thickness of the first dielectric layer is smaller than a thickness of the gate, so that the first dielectric layer covers a part of a sidewall of the gate;

forming a first spacer on an exposed sidewall of the gate;

anisotropically etching a part of the first dielectric layer until the first dielectric layer with a second thickness, with the gate and the first spacer serving as a mask, wherein the second thickness is smaller than the first thickness;

forming a second spacer to cover the first spacer and a part of the first dielectric layer;

anisotropically etching the first dielectric layer to expose the substrate with the second spacer and the gate serving as a mask;

removing the remaining first dielectric layer; and forming a second dielectric layer to cover the gate so that an air chamber is formed under the first and the second spacers.

8. The method according to claim 7, wherein the first dielectric layer has a different material from that of the first and the second spacers.

9. The method according to claim 8, wherein the first dielectric layer comprises silicon nitride, and the first and the second spacers comprise silicon nitride.

10. The method according to claim 7, wherein the step of forming a first dielectric layer with a first thickness on the substrate beside the gate comprises:

forming a planarized dielectric layer over the substrate; and etching back the planarized dielectric layer.

11. The method according to claim 7, wherein the first thickness is from about 1500 Å to about 2000 Å, and the second thickness is from about 500 Å to 1000 Å.

12. The method according to claim 7, wherein the remaining first dielectric layer is removed by wet etching.

* * * * *